US008709547B2

(12) United States Patent
Ducros et al.

(10) Patent No.: US 8,709,547 B2
(45) Date of Patent: Apr. 29, 2014

(54) METHOD FOR USING A SUPER-SLIPPERY THIN LAYER CHARACTERIZED BY THE METHOD FOR MAKING SAME

(75) Inventors: Cedric Ducros, Bevenais (FR); Jerome Gavillet, Saint-Egreve (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 162 days.

(21) Appl. No.: 13/057,039

(22) PCT Filed: Jul. 9, 2009

(86) PCT No.: PCT/FR2009/000850
§ 371 (c)(1),
(2), (4) Date: Apr. 28, 2011

(87) PCT Pub. No.: WO2010/012879
PCT Pub. Date: Feb. 4, 2010

(65) Prior Publication Data
US 2011/0192521 A1    Aug. 11, 2011

(30) Foreign Application Priority Data
Aug. 1, 2008 (FR) .................... 08 04403

(51) Int. Cl.
B05D 1/36        (2006.01)
B05D 7/00        (2006.01)

(52) U.S. Cl.
USPC ........ 427/419.7; 427/180; 427/203; 427/258; 427/261; 427/262; 427/267; 427/331; 427/404; 427/407.1; 427/409; 428/698; 428/702

(58) Field of Classification Search
None
See application file for complete search history.

(56) References Cited

U.S. PATENT DOCUMENTS

| | | | | | |
|---|---|---|---|---|---|
| 4,678,738 | A | * | 7/1987 | Shimizu et al. | 430/320 |
| 6,258,413 | B1 | * | 7/2001 | Woelki et al. | 427/402 |
| 2002/0192511 | A1 | * | 12/2002 | Hruschka et al. | 428/704 |
| 2005/0175837 | A1 | * | 8/2005 | Massler et al. | 428/408 |
| 2006/0079410 | A1 | * | 4/2006 | Yadav | 508/165 |
| 2006/0083451 | A1 | * | 4/2006 | Kawagoe et al. | 384/276 |
| 2006/0105113 | A1 | * | 5/2006 | Endicott et al. | 427/446 |
| 2007/0099014 | A1 | * | 5/2007 | McCullough et al. | 428/469 |
| 2008/0145528 | A1 | * | 6/2008 | Deng et al. | 427/180 |

OTHER PUBLICATIONS

Kim et al.; Characteristics and High Water-Repellency of a-C:H Films Deposited by R.F. PECVD; Surface & Coatings Technology; vol. 162, (2003), pp. 135-139.*

(Continued)

*Primary Examiner* — Timothy Meeks
*Assistant Examiner* — Michael P Rodriguez
(74) *Attorney, Agent, or Firm* — Oblon, Spivak, McClelland, Maier & Neustadt, L.L.P.

(57) ABSTRACT

The invention relates to the use of a super-slippery thin-layer film or coating for enhancing the lubrication capacity of a part to be subjected to great friction and wear. The film of the invention for improving the lubrication capacity of parts to be subjected to important friction and wear includes at least: a layer (3) of a hard material selected from titanium nitride (TiN), chromium nitride (CrN), titanium carbide (TiC), chromium carbide (CrC), tungsten carbide ($W_2C$) and tungsten carbide-carbon composites (WC/C), alumina ($Al_2O_3$), molybdenum sulphide ($MoS_2$), and materials of the hydrogenated amorphous carbon type (a: CH), the layer including on one surface thereof a series of dips and protrusions; and a layer (4) of an oleophilic material. The invention can particularly be used in the field of mechanics.

18 Claims, 2 Drawing Sheets

(56) References Cited

OTHER PUBLICATIONS

Wang et al.; Stable Highly Hydrophobic and Oleophilic Meshes for Oil-Water Separation; Applied Surface Science; vol. 253, (2007), pp. 9054-9060.*

Zhu et al.; Optimizing Geometrical Design of Superhydrophobic Surfaces for Prevention of Microelectromechanical System (MEMS) Stiction; Electronic Components and Technology Conference, 2006, Proceedings 56th; pp. 1129-1135.*

Che et al.; Surface Atomic Structures, Surface Energies, and Equilibrium Crystal Shape of Molybdenum; Physical Review B; vol. 57, No. 3, Jan. 15, 1998, pp. 1875-1880.*

N. Tomozeiu; Silicon Oxide (SiOx, 0<x<2): a Challenging Material for Optoelectronics; Materials and Techniques, Prof. P. Predeep (Ed. ), ISBN: 978-953-307-276-0, InTech, Available from: http://www.intechopen.com/books/optoelectronics-materials-and-techniques/silicon-oxide-siox-0-x-2-a-challenging-material-for-optoelectronics.*

Tadanaga, K. et al., Formation Process of Super-Water-Repellent Al2O3 Coating Films With High Transparency by the Sol-Gel Method, Journal of the American Ceramic Society, vol. 80, No. 12, pp. 3213-3216 (1997) XP-002507032.

Ma, M. et al., "Superhydrophobic Surfaces", Current Opinion in Colloid and Interface Science, vol. 11, No. 4, pp. 193-202 (2006) XP-005765742.

Zhu, L. et al., "Optimizing Geometrical Design of Superhydrophobic Surfaces for Prevention of Microelectromechanical System (MEMS) Stiction", Electronic Components and Technology Conference, pp. 1129-1135 (2006) XP-010923524.

Kim, J. et al., "Characteristics and High Water-Repellency of A-C:H Films Deposited by R.F. PECVD", Surface and Coatings Technology, vol. 162, No. 2-3, pp. 135-139 (2003) XP-002507033.

International Search Report Issued Nov. 2, 2009 in PCT/FR09/000850 filed Jul. 9, 2009.

Z T Kang, et al., "Synthesis of Silicon Quantum Dot Buried SiOx Films With Controlled Luminescent Properties for Solid-State Lighting", Institute of Physics Publishing, Nanotechnology, 2006, pp. 4477-4482.

* cited by examiner

Substrate or part to be treated

Step 1: Deposition of DLC (by PECVD)

Step 2: Masking + etching of the DLC + removal of the etching residues

Step 2': Deposition of nanoparticles

Step 3: Deposition of a standard oleophilic layer

METHOD FOR USING A SUPER-SLIPPERY THIN LAYER CHARACTERIZED BY THE METHOD FOR MAKING SAME

The invention relates to the use of a film or of a coating having a super-slippery thin layer in order to improve the lubricity of a part intended to be subjected to high frictions and to significant wear.

It also relates to a process for improving the lubricity of a part intended to be subjected to high frictions and to significant wear.

The phenomena of friction and of wear in metallic assemblies are found, in particular, in devices of the engine type, such as pistons, rings, camshafts, but also in fields in which friction and lubrication must be perfectly controlled, such as for hydraulic jacks, micromachines, molds, razor blades, etc.

These friction and wear phenomena are the cause of considerable energy losses.

Interest has therefore been taken, for many years, in the study of the coating that makes it possible to reduce these phenomena.

The materials that are currently most widely used as coating and subjected to these phenomena are nitrides, such as titanium nitride (TiN) and chromium nitride (CrN), carbides such as titanium carbide (TiC) and chromium carbide (CrC), tungsten carbide ($W_2C$) and tungsten carbide/carbon (WC/C) composites, oxides such as alumina, depositions based on molybdenum such as molybdenum sulfide ($MoS_2$), and also the entire family of coatings based on carbon known as diamond-like carbon (DLC). DLCs are also known as hydrogenated amorphous carbon (a:CH).

The latter, due to their exceptional combination of properties, have proved to be excellent candidates for combating these friction and wear phenomena.

Indeed, they have, at the same time, high hardnesses, low friction coefficients and low wear rates. This is why coatings of the DLC type are widely used in the mechanical field in order to improve the wear resistance and to limit frictions between various mechanical components.

For example, the mechanical and thermal stresses on the parts in friction of the moving coupling of a spark ignition engine are extremely severe.

Besides the composition of the coating material, an important point is also the lubrication of these mechanical assemblies which must be perfectly optimized in order to limit the frictions between the parts and thus to improve the efficiency of the engine and furthermore to limit the wear of these parts.

This lubrication role is therefore of prime importance in order to limit the polluting emissions released by such a system.

Furthermore, the lubricant also acts as a heat carrier by having an action against the frictions and therefore against the local temperature rises, but also by discharging the heat generated by the frictions of the various parts. The lubricants used for lubricating these parts are generally oil-based lubricants, the viscosity of which may vary.

One of the causes of wear on these coated parts is, among other things, a lack of lubrication.

Within this context, the invention aims to overcome the problem of the quality of the lubrication of parts subjected to high mechanical and thermal stresses.

For this purpose, the invention proposes the use of a film comprising at least:

one layer made of a hard material chosen from titanium nitride (TiN), chromium nitride (CrN), titanium carbide (TiC), chromium carbide (CrC), tungsten carbide ($W_2C$), and tungsten carbide/carbon (WC/C) composites, alumina ($Al_2O_3$), molybdenum sulfide ($MoS_2$), and materials of the hydrogenated amorphous carbon type (a:CH), comprising on at least one of its faces, a succession of grooves and reliefs, and one layer made of an oleophilic material, in order to improve the lubricity of parts intended to be subjected to significant wear and to high frictions.

Preferably, the layer made of a hard material is a layer made of hydrogenated amorphous carbon.

In one preferred embodiment, the film comprises, in addition, nanoparticles and/or nanotubes deposited on the inner walls of the pits of the layer.

Furthermore, preferably, the oleophilic material is a material based on SiOx.

More preferably, the oleophilic material is a material based on fluorinated organic silane compound(s).

Also, preferably, in the preferred embodiment of the invention, the nanoparticles deposited are chosen from nanoparticles of metal, of silicon, of silica, of polymer and/or of carbon and in that the nanotubes deposited are carbon nanotubes.

The invention also proposes the use of a coating obtained by the following steps:

a) deposition, onto at least one surface of a part intended to be subjected to high frictions and to significant wear, of a layer made of a hard material chosen from titanium nitride (TiN), chromium nitride (CrN), titanium carbide (TiC), chromium carbide (CrC), tungsten carbide ($W_2C$), and tungsten carbide/carbon (WC/C) composites, alumina ($Al_2O_3$), molybdenum sulfide ($MoS_2$), and materials of the hydrogenated amorphous carbon type (a:CH), b) creation of a succession of reliefs and pits in the layer obtained in step a) in order to obtain a textured layer, c) deposition, on the layer obtained in step b), of a layer made of an oleophilic material, in order to improve the lubricity of said part.

Preferably, the textured layer is a layer made of hydrogenated amorphous carbon.

In one preferred embodiment, the coating used in the invention is obtained by steps a), b) and c) and in addition, after step b) and before step c), a step b1) of depositing nanoparticles and/or nanotubes onto the textured layer followed by a step b2) of polishing the upper surface of the layer obtained in step b1).

Preferably, the oleophilic material is a material based on SiOx.

More preferably, the oleophilic material is a material based on fluorinated organic silane compound(s).

In the case where the nanoparticles are deposited in step b1), these are chosen from nanoparticles of metal, of silicon, of silica, of polymer and/or of carbon and when nanotubes are deposited in step b1), these are carbon nanotubes.

The invention also proposes a process for improving the lubricity of a part intended to be subjected to significant wear and to high frictions, comprising the following steps:

a) deposition, onto at least one surface of a part of a layer made of a hard material chosen from titanium nitride (TiN), chromium nitride (CrN), titanium carbide (TiC), chromium carbide (CrC), tungsten carbide ($W_2C$), and tungsten carbide/carbon (WC/C) composites, alumina ($Al_2O_3$), molybdenum sulfide ($MoS_2$), and materials of the hydrogenated amorphous carbon type (a:CH), b) creation of a succession of reliefs and pits at the free surface of the layer obtained in step a), in order to obtain a textured layer, c) deposition, on the textured layer obtained in step b), of a layer made of an oleophilic material.

Preferably, the hard material making up the layer deposited in step a) is hydrogenated amorphous carbon.

In one preferred embodiment, the process of the invention comprises, in addition, after step b) and before step c), a step b1) of depositing nanoparticles and/or nanotubes onto the textured layer obtained in step b) followed by a step b2) of polishing the upper surface of the layer obtained in step b1).

Preferably, in the processes of the invention, the oleophilic material is a material based on SiOx.

More preferably, the oleophilic material is a material based on fluorinated organic silane compound(s).

Preferably, when the nanoparticles are deposited in step b1), they are chosen from nanoparticles of metal, of silicon, of silica, of polymer and/or of carbon and when nanotubes are deposited in step b1), these are carbon nanotubes.

The invention will be better understood and other advantages and features thereof will appear more clearly on reading the explanatory description which follows and which is given with reference to the figures in which:

The parts subjected to frictions and which undergo significant wear are in general coated with a hard material that is itself friction resistant and wear resistant.

Thus, in the present invention, the expression "hard material" will be understood to mean materials that are known and generally used for, in particular, coating parts subjected to frictions, the wear of which must be reduced. These hard materials are currently nitrides such as titanium nitride (TiN) and chromium nitride (CrN), carbides such as titanium carbide (TiC) and chromium carbide (CrC), tungsten carbide ($W_2C$), and tungsten carbide/carbon (WC/C) composites, oxides such as alumina ($Al_2O_3$), depositions based on molybdenum such as molybdenum sulfide ($MoS_2$), and also the entire family of coatings based on carbon known as diamond-like carbon (DLC).

Materials of DLC type are also known as hydrogenated amorphous carbon (a:CH). They have, at the same time, high hardnesses and low friction coefficients and low wear rates. This is why they are widely used in the mechanics field as a coating for parts subjected to frictions and to wear, in order to improve their wear resistance and to limit the frictions between the various mechanical components.

These coatings, constituted of a thin layer, in particular of DLC type, may furthermore be surface-textured in order to improve the lubrication efficiency of the contacts between mechanical parts.

Figure 2:
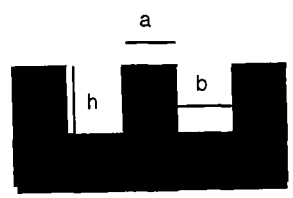

The surfaces of the coatings are said to be textured when they comprise a series of patterns that define hollows and reliefs, as represented in FIG. 2 for example.

It must henceforth be noted that, although in FIG. 2 the shape of the pits formed is of rectangular type, the morphology of the pits and also of the reliefs is not a first-order parameter, which allows diverse and varied geometries, such as cones, cylinders or cubes, to be defined and produced.

The important parameters of the pattern formed by the succession of pits, also referred to here as hollows, and of the reliefs are three in number, independently of one another:

the parameter a defining the width of each relief and which may vary between 1 μm and 100 μm inclusive, the parameter h defining the height of the relief, which therefore corresponds to the depth of the pit, and which may vary between 30 nm and 2 μm inclusive, and the parameter b), which defines the width of the pit.

This parameter b may vary along the height or depth h in order to form patterns other than those rectangular patterns shown in FIG. 2, for example to form pits of cone shape or another shape.

In the invention, the thickness of this hard layer is preferably between 1 μm and 20 μm inclusive. Most preferably, it is 5 μm.

The thicknesses mentioned above are those of the hard layer deposited, before the texturing thereof.

Indeed, after texturing, the hard layer comprises zones of less thicknesses, corresponding to the micropits.

The fluid which is to be trapped is, in the case of the invention, the lubricant used to limit the frictions between the parts and to limit the wear of these parts.

The lubricants used in the invention are, in general, oil-based lubricants.

Thus, in the invention, the term "lubricant-philic" means "oleophilic" and the two terms are used inter-changeably.

However, even with a textured surface and the use of lubricant, the parts subjected to intense frictions such as the parts of the mobile coupling system of a spark ignition engine wear very rapidly, namely because the lubrication is often not applied in the desired geometric zones.

Thus, the objective of the invention is to functionalize the coating made of a hard material, more preferably made of hydrogenated amorphous carbon (tribological deposition), in the stressed zones in order to render its surface "attractive" for the lubricant.

In order to do this, two methods are used.

The first consists in texturing the surface of the deposition of the layer made of a hard material over a portion of the surface of the part or over its entire surface.

This step consists in creating microreservoirs (the pits) of precise size, distribution and density at the surface of the coating made of a hard material.

But the heart of the invention lies in the combination of the second means which is combined with the first means described above. This second means consists in depositing an oleophilic coating on the textured surface made of a hard material, including inside the microreservoirs previously formed during the texturing of the surface of the hard material.

Such a coating architecture is particularly interesting for a tribological application. Indeed, the oleophilic layers, for example the polymer layers or films, deposited for example by PECVD (plasma-enhanced chemical vapor deposition), make it possible to retain the lubricant but are not renown for their resistance to abrasive wear unlike the deposition of a hard material such as a DLC-type material.

However, it has surprisingly been observed that during use, due to the presence of the oleophilic surface layer, the lubricant will wet the entire surface thus coated, including the microreservoirs formed by the texturing but, by wearing down rapidly, that is to say as soon as the parts have been run-in, the oleophilic layer will disappear.

Hence, the frictions will take place on the layer of hard material. The lubricant will therefore be forced and attracted into the microreservoirs, the layer made of an oleophilic material being present in the bottom of these cavities.

The thickness of the oleophilic layer deposited is preferably, in the invention, between 5 and 200 nm. Most preferably, it is 100 nm.

The advantage compared to a coating made of a textured hard material alone is three-fold:
- firstly, the lubrication is particularly effective in the thermomechanically stressed zones, where the contact pressures are particularly high,
- secondly, the fact of trapping lubricant in the microreservoirs formed during the texturing makes it possible to have a constant source of lubricant, even during a change in the friction conditions, such as a change in the rate of sliding of the parts, a change in the contact pressure, which is equivalent to Hertzian conditions, and
- thirdly, the wear debris generated by the significant abrasive wear during this type of stress is trapped in these reservoirs and thus the formation of a third body in the friction zone is limited. Indeed, this debris is often hard particles that form extremely hard and abrasive depositions that contribute to severe damaging of the parts.

In other words, the main advantage compared to a textured hard material coating according to the prior art is that the lubricant is located and trapped within the microreservoirs formed by the texturing owing to the oleophilic coating. A simple surface texturing would be much less effective in terms of lubrication when the Hertzian conditions are variable, such as is the case for a cam/pawl contact for example.

The material used to form the oleophilic layer may be any material suitable for this purpose. Hydrocarbon materials are one example of materials having a wetting affinity with fatty substances. These may be deposited as thin layers via various methods such as sol-gel methods, or gaseous routes. The metal-organic chemical vapor deposition (MOCVD) technique is one of the deposition methods which can be used.

In concrete terms, the oleophilic material acts to preferentially retain lubricant within the pits obtained by texturing. In practice, it is required to have a contact angle of less than 90° and preferably of less than 70° between the oleophilic material and the lubricant. For example, materials of SiOx (substoichiometric silica) type have a contact angle of the order of 20° with respect to a commercial motor oil, likewise an SiOC material has a contact angle of the order of 40° with respect to a commercial motor oil, thus demonstrating their oleophilic natures.

Moreover, the oleophilic material could develop a polar nature which will favor its contact with a polar lubricant unlike DLC which is non-polar.

One particularly preferred example of an oleophilic material used within the invention is an organic material of silane type, which is preferably fluorinated, such as for example $F(CF_2)_n—CH_2CH_2Si(OH)_3$. Such a material is described in Wang et al., "Stable highly hydrophobic and oleophilic meshes for oil-water separation" Applied Surface Science 253 (2007) 9054-9060.

Other oleophilic materials can be envisaged, in accordance with the knowledge of a person skilled in the art in this field, such as for example Teflon films (CF).

According to one development of the invention, it is advantageous to provide a step b1), before step c), which consists in depositing nanoparticles and/or nanotubes in the bottom of the pits according to a nanostructuring principle. Said nanoparticles and/or said nanotubes may be deposited by CVD and may be composed of a metal chosen from those from columns VIIIB and IB of the Periodic Table of the Elements or from an oxide of these metals. Other nanoparticles that can be envisaged are nanoparticles of silica, of polymer (polystyrene, polycarbonate), of silica and/or of carbon. The nanotubes that can be envisaged are carbon nanotubes.

In concrete terms, the nanotexturing originating from the deposition of the nanoparticles and/or nanotubes will render the texturings particularly attractive for the oils and will promote the wetting with respect to these oils. In other words, this nanotexturing functions like an oil sponge.

When a step b) is used in the process of the invention, advantageously the deposition of the oleophilic layer carried out in step c) does not completely cover the nanoparticles and/or the nanotubes so as to induce a synergistic effect of the oleophilic functions of the layer (4) and of the nanotexturing that promotes the wetting. Thus, for example, SiOC alone has a contact angle of 40° for the oil, which changes to 20° if the SiOC is deposited on nanostructures.

Also, depending on the deposition processes involved, step b1) may be after step c).

In order to better understand the invention, one embodiment will now be described by way of a purely illustrative and non-limiting example.

EXAMPLE 1

Deposition of a Coating According to the Invention

Figure 1:
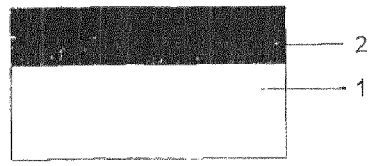
FIG. 1 schematically represents each step of the preferred embodiment of the process of the invention, that is to say of the use according to the invention, and FIG. 2 schematically represents a texturing pattern of the surface of the hard material used in the invention.
Figure 1:
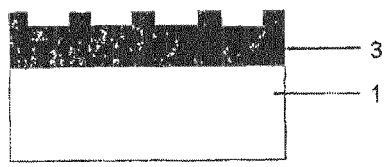
Figure 1:
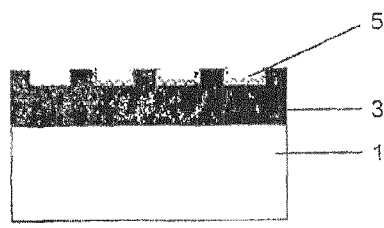
Figure 1:
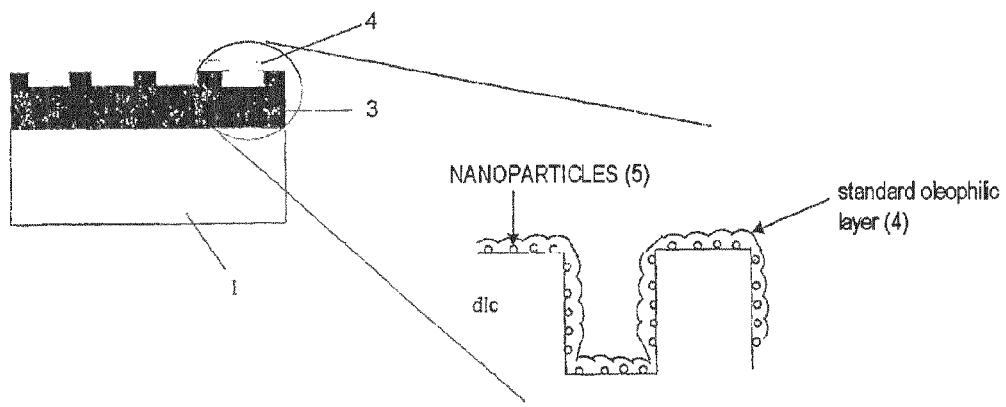

The various steps of the process for depositing a film used in the invention are schematically represented in FIG. 1.

Firstly, a substrate to be treated, that is to say the part intended to be subjected to intense frictions and to significant wear, based on steel, is cleaned and prepared for the deposition.

This substrate is denoted by 1 in FIG. 1.

The first step of the process according to the invention then consists in depositing a layer with a thickness of 5 μm made of a hard material, here a layer of hydrogenated amorphous carbon, by chemical vapor deposition (CVD). This deposit may also be deposited by a physical vapor deposition (PVD).

The main properties of the coating of hard material are of tribological nature: hardness between around 15 and around 25 GPa, preferably of around 20 GPa, friction coefficient under lubricated conditions facing a steel of 100C6 type of less than 0.1, and preferably of less than 0.05. The friction coefficient is measured in a pin-on-disc tribological test. The thickness of the coating, which is denoted by 2 in FIG. 1, is between 1 and 10 μm, inclusive, depending on the application.

Step 2 then consists in anisotropically etching the layer 2 of DLC type with elemental patterns having sizes, aspect ratios and degrees of opening as described previously, in order to texture the layer of hard material.

This texturing may be obtained, for example, by dry etching (plasma etching) using a mask. This mask may be produced by direct application of a grating (for example metal grid), by photolithography (photosensitive), by direct writing using a laser (photosensitive). After etching, the mask is removed manually or chemically, such as with the aid of a solvent for a resine. The etching residues are cleaned via a dry and/or wet chemical route.

The textured layer denoted by 3 in FIG. 1 is then obtained.

In order to further improve the texturing of the surface of the layer 3, a step 2' denoted in FIG. 1 may be carried out. This step is optional. It consists of depositing nanoparticles 5 on the textured layer 3, this deposition following the shape of texturing of the layer 3.

These nanoparticles are preferably nanoparticles having a diameter between 50 and 500 nm inclusive, a random shape dependent on the embodiment, but mainly spherical, made of a metal such as Ni, Ag, Al or else made of silicon.

The upper surface of the deposition of nanoparticles is then polished in order to regain the flatness over the part a of the structuring patterns.

Finally, the third step of the process according to the invention consists in depositing, on the layer 3, or on the layer 5, a layer denoted by 4 in FIG. 1, made of an oleophilic material of SiOx type, having a thickness of 100 μm.

The layer 4 made of an oleophilic material also follows the shape of the texturing patterns of the textured layer 3.

This layer 4 may be deposited by various processes, for example by deposition in the aqueous phase or under vacuum. This layer must have a high enough surface energy to guarantee the wetting of the fluid on the layer 2. In practice, it is considered that a surface energy greater than 50 mN/m makes it possible to favor the location of the lubricant in contact with the oleophilic material rather than in contact with the DLC. Preferably, a surface energy greater than 80 mN/m will be desired.

A coating was thus obtained which is used in the invention for improving the lubricity of a part intended to be subjected to significant wear and to intense frictions.

The coating is a film comprising a thin textured layer 3 made of a hard material, here hydrogenated amorphous carbon, this layer 3 being textured and covered either with a layer 4 made of an oleophilic material, here SiOx, or comprising a thin layer 3 made of a hard material, here textured hydrogenated amorphous carbon, the layer 3 being itself coated with a layer of nanoparticles 5 that is itself coated with the layer 4 made of an oleophilic material.

This coating or film of the invention is not limited to only the hard materials and materials composed of all the hard and oleophilic materials mentioned in the present description, whether or not this is in combination with nanoparticles and/or nanotubes described in the present description.

Thus, another coating or film used in the invention is a coating comprising a textured thin layer 3 made of a hard material covered with a layer 4 made of an oleophilic material, this layer 4 being itself coated with a layer of nanoparticles and/or of nanotubes 5.

Also, another coating used in the invention is the coating after running-in of the part, that is to say one of the coatings as described previously but that does not cover the entire surface of the layer 3 or of the layer 5, but only the inner walls of the hollows forming the layer 3 or the layer 5.

This coating may be applied to hydraulic jacks, micromachines, molds, razor blades, engine parts, surgical implants, etc.

Thus, the coating used in the invention, by calling it a coating, it will appear clearly to a person skilled in the art that this coating is constituted of a multilayer film, one layer of which is the layer (3) and the second layer is the layer (4), and that optionally comprises nanoparticles and/or nanotubes deposited on the walls of the grooves of the layer (3).

Thus, in the same way, although in example 1 the steps of the process for depositing a coating or film used in the invention were described, it will appear clearly to a person skilled in the art that the various steps of this process are also the various steps of the process for improving the lubricity of a part intended to be subjected to significant wear and to high (intense) frictions.

The invention claimed is:

1. A method of improving lubricity of a part subjected to wear or friction, the method comprising:
    applying to the part a film comprising:
        a first layer comprising a hard material selected from the group consisting of titanium nitride (TiN), chromium nitride (CrN), titanium carbide (TiC), chromium carbide (CrC), tungsten carbide ($W_2C$), a tungsten carbide/carbon (WC/C) composite, alumina ($Al_2O_2$), molybdenum sulfide ($MoS_2$), and a hydrogenated amorphous carbon material (a:CH); and
        a second layer comprising an oleophilic material;
    wherein
        a face of the first layer comprises a succession of pits and reliefs, the pits having a depth between 30 nm and 2 μm,
        the second layer is a continuous layer which conforms across the face of the first layer,
        a surface energy of the surface of the second layer is greater than 50 mN/m, and
        a thickness of the second layer is from 5 to 200 nm.

2. The method of claim 1, wherein the hard material of the first layer is hydrogenated amorphous carbon.

3. The method of claim 1, wherein the film further comprises, at least one selected from the group consisting of nanoparticles and nanotubes, deposited on inner walls of the pits and reliefs of the first layer.

4. The method of claim 1, wherein the oleophilic material comprises SiOx in which x is greater than 0 and lower than 2.

5. The method of claim 1, wherein the oleophilic material comprises at least one fluorinated organic silane compound.

6. The method of claim 3, wherein
    when the nanoparticles are deposited, the nanoparticles comprise at least one material selected from the group consisting of metal, silicon, silica, polymer, and carbon, and
    when the nanotubes are deposited, the nanotubes are carbon nanotubes.

7. A method of improving lubricity of a part, comprising coating the part with a coating obtained by:
    a) depositing onto at least on surface of the part a first layer comprising a hard material chosen from titanium nitride (TiN), chromium nitride (CrN), titanium carbide (TiC), chromium carbide (CrC), tungsten carbide ($W_2C$), a tungsten carbide/carbon (WC/C) composite, alumina ($Al_2O_3$), molybdenum sulfide ($MoS_2$), and a hydrogenated amorphous carbon material (a:CH),
    b) creating a succession of reliefs and pits having a depth comprised between 30 nm and 2 μm in the first layer, to obtain a textured layer,
    c) depositing on the textured layer a continuous oleophilic layer conforming to the textured layer, said oleophilic layer having a surface energy greater than 50 mN/m and a thickness of from 5 to 200 nm.

8. The method of claim 7, wherein the textured layer comprises hydrogenated amorphous carbon.

9. The method of claim 7, further comprising, after the creating b) and before the depositing c):
    b1) depositing at least one selected from the group consisting of nanoparticles and nanotubes onto the textured layer, to give a deposited layer; and
    b2) polishing an upper surface of the deposited layer obtained in b1).

10. The method of claim 7, wherein the oleophilic layer comprises SiOx wherein x is greater than 0 and lower than 2.

11. The method of claim 7, wherein the oleophilic material of the oleophilic layer comprises at least one fluorinated organic silane compound.

12. The method of claim 9, wherein
    when nanoparticles are deposited the nanoparticles comprise at least one material selected from the group consisting of metal, silicon, silica, a polymer, and carbon, and
    when nanotubes are deposited the nanotubes are carbon nanotubes.

13. A process for improving lubricity of a part, the process comprising:
- a) depositing onto at least one surface of the part, a first layer comprising a hard material selected from the group consisting of titanium nitride (TiN), chromium nitride (CrN), titanium carbide (TiC), chromium carbide (CrC), tungsten carbide ($W_2C$), a tungsten carbide/carbon (WC/C) composite, alumina ($Al_2O_3$), molybdenum sulfide ($MoS_2$), and a hydrogenated amorphous carbon material (a:CH);
- b) creating a succession of reliefs and pits having a depth between 30 nm and 2 μm on a free surface of the first layer to obtain a textured layer; and
- c) depositing on the textured layer a continuous oleophilic layer conforming to the textured layer, said oleophilic layer comprising an oleophilic material, wherein
- a surface energy of the oleophilic layer is greater than 50 mN/m and a thickness of the oleophilic layer is from 5 to 200 nm.

14. The process of claim 13, wherein the hard material of the first layer is hydrogenated amorphous carbon.

15. The process of claim 13, further comprising, after the creating b) and before the depositing c):
- b1) depositing at least one selected from the group consisting of nanoparticles and nanotubes onto the textured layer, to give a treated layer; followed by
- b2) polishing an upper surface of the treated layer.

16. The process of claim 13, wherein the oleophilic material comprises $SiO_x$ in which x is greater than 0 and lower than 2.

17. The process of claim 13, wherein the oleophilic material comprises at least one fluorinated organic silane compound.

18. The process of claim 15, wherein
when nanoparticles are deposited in the depositing b1) the nanoparticles comprise at least one material selected from the group consisting of metal, silicon, silica, a polymer, and carbon, and
when nanotubes are deposited in the depositing b1), the nanotubes are carbon nanotubes.

* * * * *